United States Patent [19]

Steinmayer, Jr. et al.

[11] Patent Number: 4,651,114

[45] Date of Patent: Mar. 17, 1987

[54] PULSE REPETITION MODULATOR APPARATUS

[75] Inventors: Alwin G. Steinmayer, Jr., Berwyn, Pa.; Ralph O. Williams, Orient, N.Y.

[73] Assignee: The United States of America as represented by the Secretary of the Air Force, Washington, D.C.

[21] Appl. No.: 824,998

[22] Filed: Feb. 3, 1986

[51] Int. Cl.⁴ .............................................. H03K 7/00
[52] U.S. Cl. .................................... 332/9 R; 331/173; 455/95; 455/116
[58] Field of Search ................ 332/9 R, 10; 331/173; 455/95, 116; 375/22, 23, 59; 340/345, 348, 353, 355, 359, 539

[56] References Cited

U.S. PATENT DOCUMENTS

| | | | |
|---|---|---|---|
| 2,430,139 | 11/1947 | Peterson | 250/6 |
| 2,568,721 | 9/1951 | Deloraine et al. | 179/15.6 |
| 3,045,071 | 7/1962 | Matthews et al. | 179/15 |
| 3,534,728 | 10/1970 | Barrows | 128/2.06 |
| 3,605,020 | 9/1971 | Sullivan, Jr. | 455/116 |
| 4,118,677 | 10/1978 | Weldon | 331/173 X |
| 4,401,977 | 8/1983 | Taylor | 340/539 |

Primary Examiner—Eugene R. LaRoche
Assistant Examiner—Robert J. Pascal
Attorney, Agent, or Firm—William Stepanishen; Donald J. Singer

[57] ABSTRACT

A pulse repetition modulator apparatus having a pulse width modulator to supply a series of maximum transmitter power output bursts that have been generated with a pulse time correlation to the sampled amplitude of the voice signal input to the link. The output bursts would therefore be of variable length with the durations proportional to the amplitude of the voice input signal.

8 Claims, 8 Drawing Figures

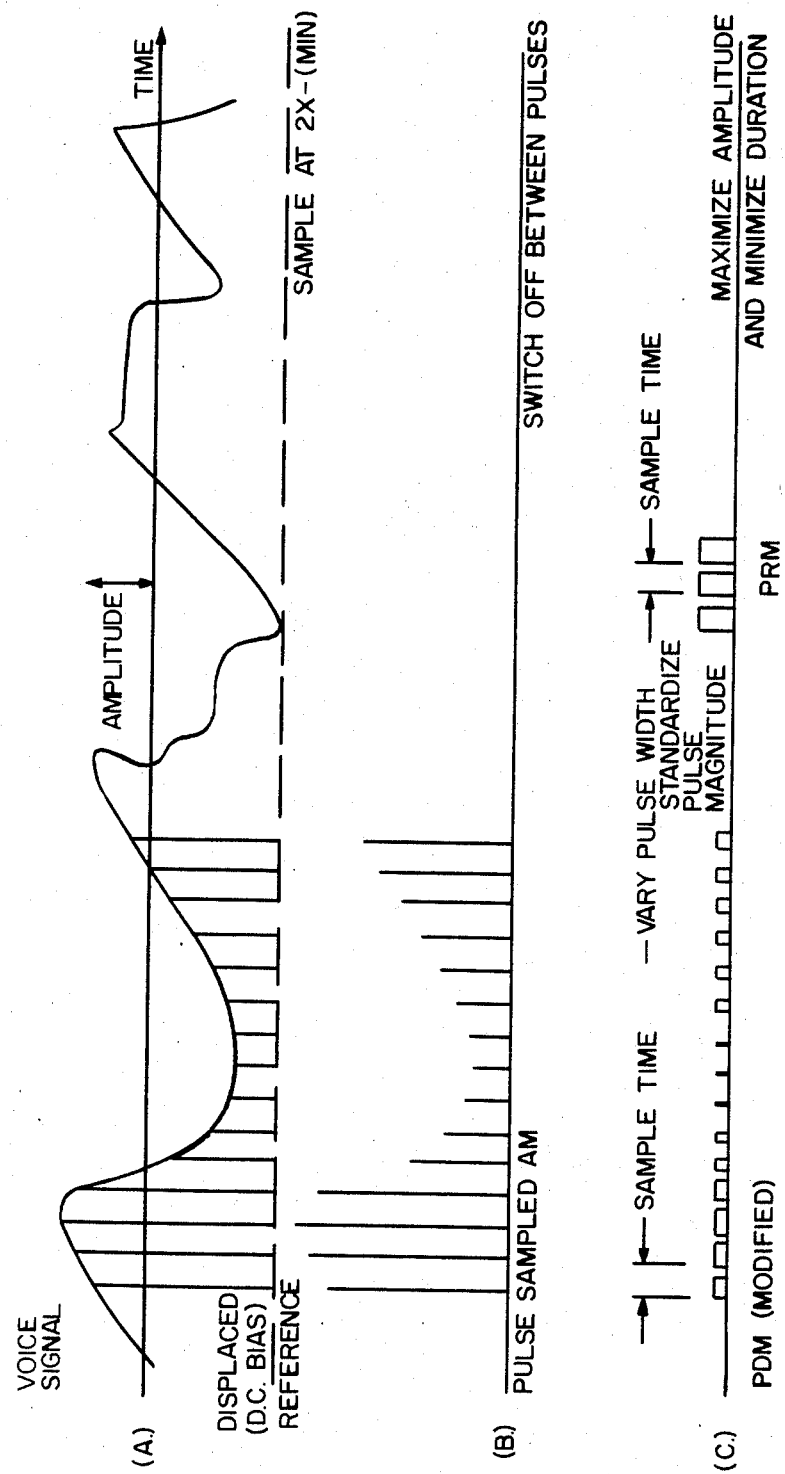

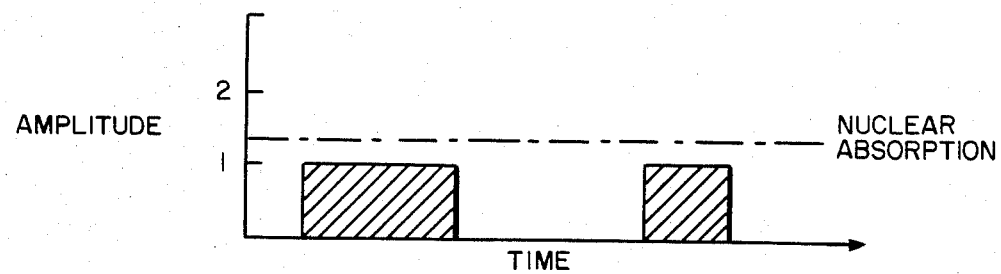
FIG. 2a OLD
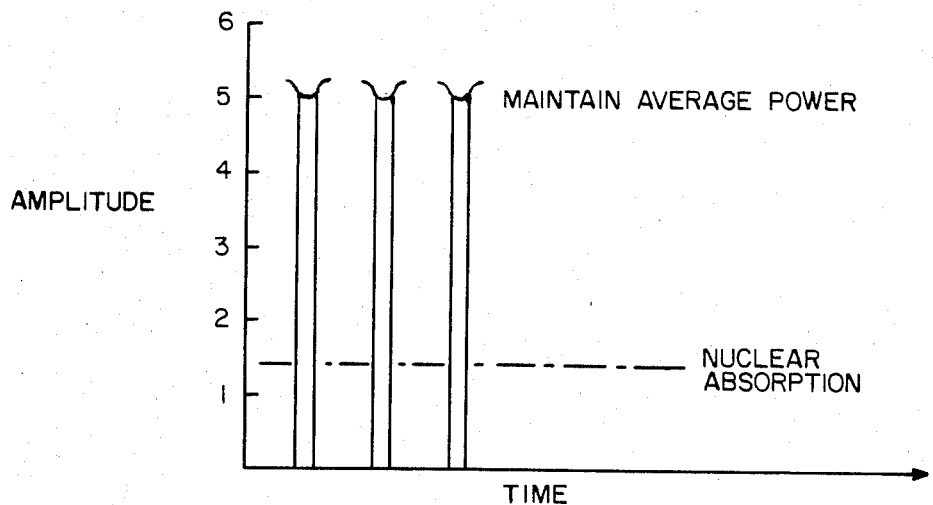
FIG. 2b NEW
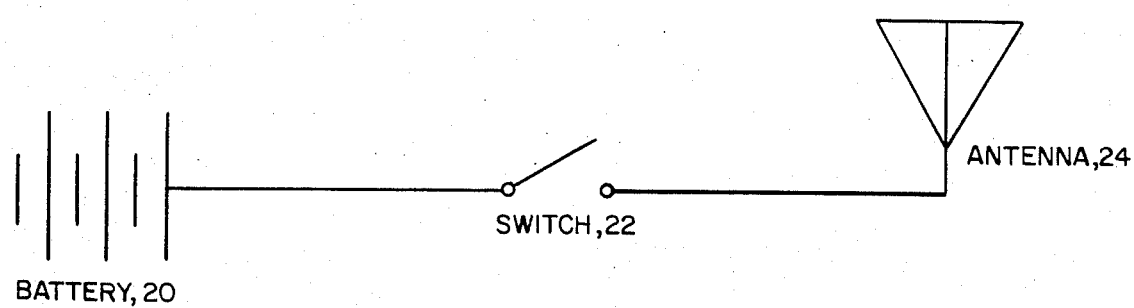
FIG. 3

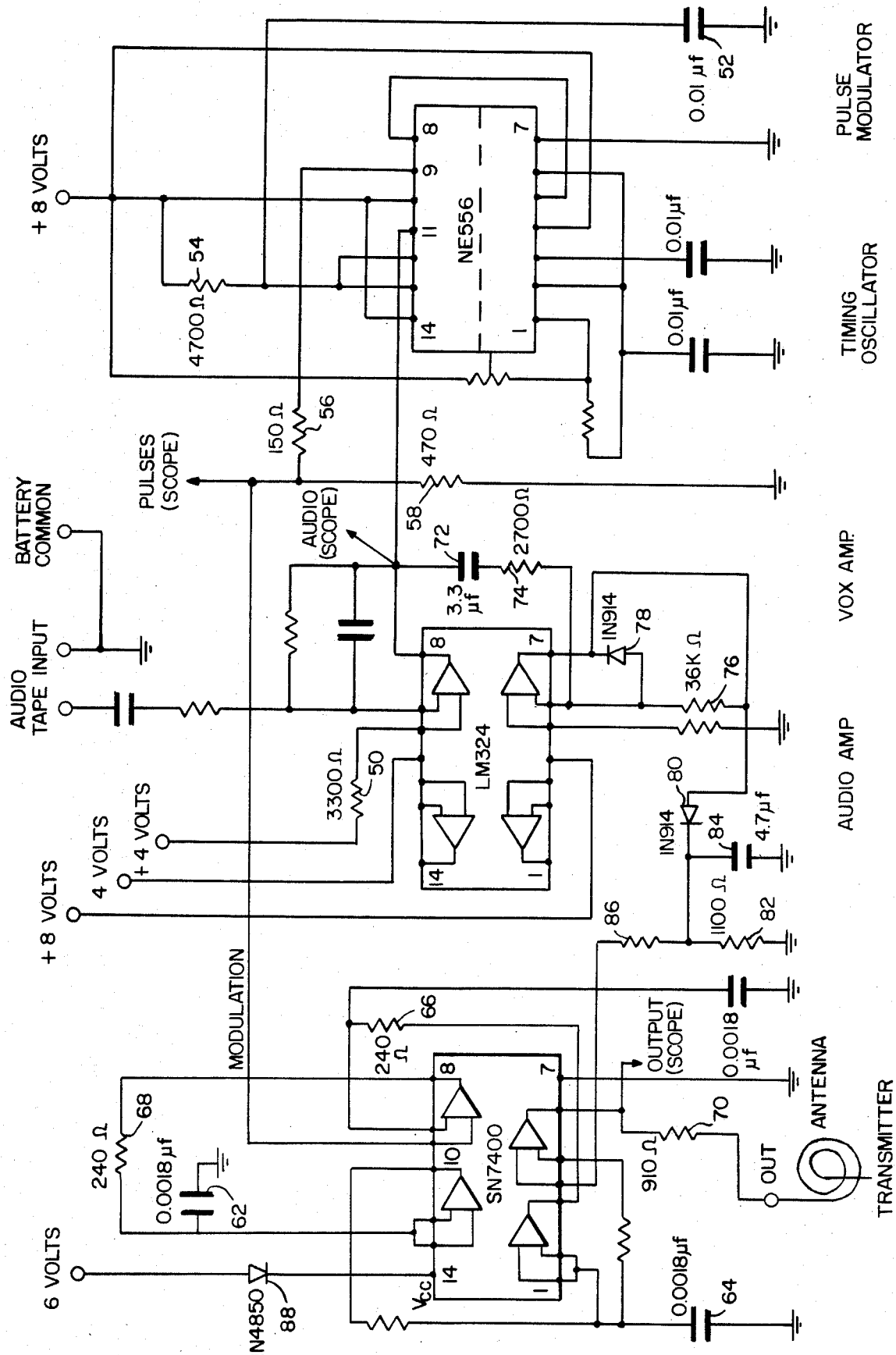

PULSE REPETITION MODULATOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a modulation apparatus, and in particular to a pulse repetition modulation apparatus for the Improved Emergency Rocket Communication System (IERCS).

It will be well recognized that the possibility of enemy high altitude nuclear warhead detonations for purposes of land based missile pin-down becomes an almost certainty when the effects of this class of attack on communication is also considered. A series of studies of the relative efficiency of voice signals compared to digital signals, readily identified that for an EAM type message (where a limited number of alphanumerics are to be transmitted repetitiously and message piecing is permitted) a digital message is far more robust in a nuclear disturbed environment. The possibility of the modification of one of the many type of AM voice receivers proliferated with the armed forces was investigated by GE and Magnavox and it was concluded that the current AN/ARC-164 radio could be readily modified. The preferred alternative, in spite of the nuclear problem is to employ a voice transmitter in the IERCS vehicle. In view of the above, the following criteria were identified for this voice amplifier:

It must be added to DSCS-III Transpoder in the IERCS concept;

It must function with existing unmodified military UHF AM voice receivers;

It must provide a robust signal in a nuclear environment;

It must not add weight to IERCS that would degrade coverage/time performance.

The voice amplifier would be required to function over the increased ranges of the IERCS (as compared to the current ERCS) with sufficient power to be detected via the belly mounted antenna of a strategic tanker (as an example) into the whole spectrum of AM military voice radios. Thus, the link parameters place one major set of constraints on the voice amplifier design. The above noted voice radio must fit into the IERCS vehicle with minimum impact on needed power, (battery weight) needed cooling, (structure and-/or cooling mechanism) and needed volume.

The state of the art of radio voice transmission is well represented and alleviated to some degree by the prior art apparatus and approaches which are contained in the following U.S. patents:

U.S. Pat. No. 2,430,139 issued to Peterson on Nov. 4, 1947;

U.S. Pat. No. 2,568,721 issued to Deloraine et al on Sept. 25, 1951;

U.S. Pat. No. 3,045,071 issued to Matthews et al on July 17, 1962;

U.S. Pat. No. 3,534,728 issued to Barrows on Oct. 20, 1967; and

U.S. Pat. No. 4,401,977 issued to Taylor on Aug. 30, 1983.

The Taylor reference discloses a radio transmitter which transmits bursts of oscillation at a preset carrier frequency for a preset number of carrier frequency cycles in each burst. The patent provides a relatively simple system in which the transmitter is controlled by a logic circuit that is driven by a counter which counts the number of oscillations in a transmission burst. The Peterson reference illustrates a communication system which utilizes spaced pulses of substantially equal length. The number of pulses which are transmitted varies with respect to the useful modulation. The Deloraine et al reference shows a communication system which utilizes an impulse modulation transmission system in which the impulses are transmitted at quite definite fixed moments and have a constant amplitude. Since the length of time during which the receiving circuit is in condition to receive can be reduced down to the duration of the impulses, thus the time during which interferences can act is considerably lessened. The Matthews et al reference is concerned with the problem of transmitting information over lines which are normally used for speech transmission. This reference discloses an apparatus for converting information that is represented by a direct voltage of varying magnitude into an alternating voltage having a frequency representative of the amplitude of the direct voltage. The invention comprises a saw-tooth generator for producing a saw-tooth signal, the amplitude of which increases from a datum at a predetermined rate and a comparator means arranged to compare the voltage to be converted with the saw-tooth generator output voltage and to cut-off and re-start the saw-tooth generator when the compared voltages are in predetermined relationship, whereby the saw-tooth generator produces a saw-tooth output that has a repetition frequency which is dependent on the voltage level that is to be converted. The Barrows reference presents a physiological parameter measuring system which employs a single blocking oscillator whose pulse repetition frequency is modulated by the parameters that are to be measured. However, none of the references disclose a voice link compatable with existing Air Force radios for penetrating nuclear environments. The present invention is intended to satisfy that need.

SUMMARY OF THE INVENTION

The present invention utilizes pulse repetition modulation in a voice communication link to provide short, intense pulses which will pierce the nuclear attenuation in a nuclear environment with minimum signal degradation. The link is compatable with existing Air Force radios without modification and uses constant power pulses. The pulse transmitter is an RC oscillator which generates a near square wave at 1.1 MHz that is turned on and off by two control signals. One signal which is generated by a pulse width modulator, permits the output to be generated during the time which the modulating pulse is on. Each transmitting output burst comprises a fixed number of transmitted carrier pulses plus or minus another number of pulses that is proportional to the sampled instantaneous amplitude of the voice input signal. The second turn-on signal is generated by a voice-operated controller which turns on the transmitter when the voice input signal exceeds a level that is slightly above the background noise. Its purpose is to avoid generating output when no information is to be handled by the IERCS voice link.

It is one object of the invention, therefore, to provide an improved pulse repetition modulation apparatus.

It is another object of the invention to provide an improved pulse repetition modulation apparatus wherein UHF/VHF receivers having simple amplitude demodulation and signal bandwidths of 40 KHz and audio bandwidths of 5 KHz or less are utilized;

It is another object of the invention to provide an improved pulse repetition modulator apparatus wherein the transmitted signal utilizes simultaneous transmission of a carrier and at least one information-bearing sideband;

It is another object of the invention to provide an improved pulse repetition modulator apparatus wherein the transmitted signal utilizes to be some form of constant amplitude pulses;

It is another object of the invention to provide an improved pulse repetition modulator apparatus wherein the transmission signals must have characteristics that are suited for penetration of a nuclear disturbed environment; and, It is another object of the invention to provide an improved pulse repetition modulator apparatus wherein a low weight transmitter that is suitable for rocket boosting is utilized.

BRIEF DESCRIPTION OF THE DRAWINGS

FIGS. 1a–1c are graphical representations of the signal developments in the pulse repetition modulation apparatus, FIGS. 2a, 2b are graphical representations respectively, of the average power content of the old and new concept of power pulsing signals versus nuclear absorption, FIG. 3 is a simplified schematic diagram of the basic concept of the pulse repetition modulation.

DESCRIPTION OF THE PREFERRED EMBODIMENT

Figure 4:
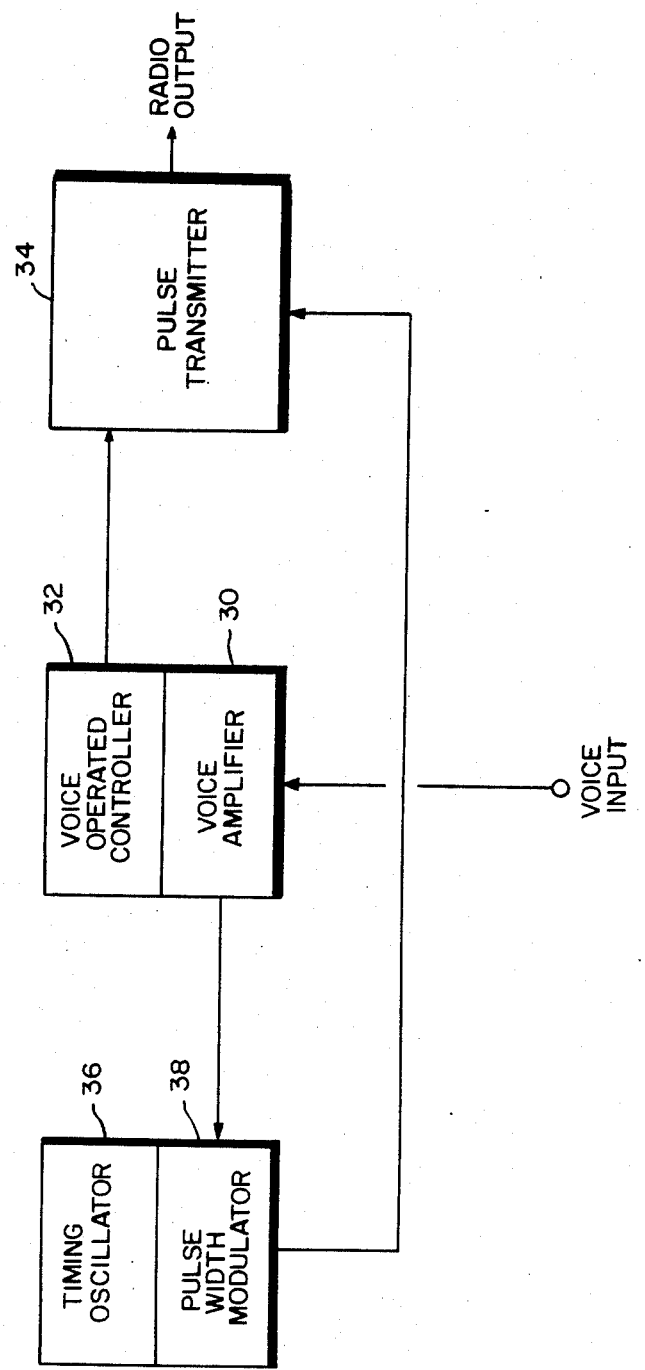
FIG. 4 is a block diagram of the pulse repetition modulation apparatus according to the present invention, and, FIG. 5 is a schematic diagram of the pulse repetition modulation apparatus.

Referring now to FIGS. 1a–1c, there is shown one form of signal that can meet the above communication link constraints. It is a series of maximum transmitter power output bursts that have been generated with a pulse time correlation to the sampled amplitude of the voice signal input to the communication link. The signal output bursts would therefore be of variable length with the durations proportional to the amplitude of the voice input signal. In FIG. 1a, there is shown a graphical representation of a typical voice input signal. This voice input signal may have an amplitude range between ± one volt and exhibit a spectrum of 300 to 3000 Hz. In FIG. 1b there is shown a graphical representation of the voice input signal wherein it has been translated in the positive direction so that the negative maximum instantaneous excursion is still a positive voltage. The sampling times are indicated by vertical lines.

There is shown in FIG. 1c a graphical representation of the sampled pulse signal of FIG. 1b which was pulse duration modulated. The pulse duration modulated (PDM) signal of FIG. 1c shows a series of pulses whose width (duration) is varied to reflect the amplitude of an expanded section of the signal in FIG. 1b.

It will be noted that, in a nuclear environment, there is a distinct advantage of going yet one step further to the creation of a series of short but intense pulses which are capable of achieving some measure of immunity to nuclear absorption. In FIGS. 2a, 2b there is clearly illustrated this concept wherein the pulse width is reduced and the pulse intensity is increased in order to keep the average power constant. The amount to be gained, in ability to overcome nuclear absorption is yet to be quantified. However, it may be clearly seen in FIGS. 2a, 2b that the amplitude of the pulse duration modulated signal is above the boundary line of nuclear absorption.

The basic concept of the present approach of the pulse repetition modulation apparatus is simply shown in FIG. 3 which shows a power supply unit 20 that is connected to an antenna unit 24 by means of a switch unit 22. The power supply unit 20 is modulated by the input signal that is applied to the in-line switch unit 22 which is articulated adroitly so as to cause a standard AM receiver to accept the signal as a normal voice input. This simplified approach is believed to be efficient, nuclearly robust, and conceptually attractive.

Turning now to FIG. 4, there is shown a block diagram of the pulse repetition modulator apparatus which utilizes a voice amplifier unit 30 to receive the voice input signal. A voice-operated controller unit 32 which is operatively connected to the voice amplifier unit 30, provides a control signal to the pulse transmitter unit 34. The pulse width modulator unit 38 receives an amplified voice signal from the output of the voice amplifier. A timing oscillator unit 36 is operatively connected to the pulse width modulator unit to provide timing signals thereto. The output signal from the pulse width modulator unit 38 is applied to the pulse transmitter unit 34 for transmission under control of the control signal from the voice-operated controller unit 32.

The block diagram of the demonstration unit which is given in FIG. 4 was utilized to demonstrate how a radio operator might respond to the pulsed output signal. At this point, an additional constraint was introduced to those given earlier: the cost of the apparatus was to be kept to a minimum. In order to minimize the cost, operation through a simple broadcast receiver which is tuned to about the middle of the standard broadcast band was chosen to avoid having to build a VHF/UHF transmitter and receiver. Carrier frequency scaling does not present an obstruction to the effectiveness of the concept.

The pulse repetition modulator apparatus operates in the following manner. The voice input signal which is used in the demonstration unit is taken from a portable tape recorder in order to enable easy comparison of the input and output messages. The sampling pulses which are produced by the timing oscillator unit 36 have a frequency of 10,000 pulses per second. These sampling pulses are applied to the pulse-width modulator unit 38 to trigger it on and off. The modulator unit 38 charges a sampling capacitor until it reaches the instantaneous value of the signal that is fed to it from the voice amplifier unit 30. With a high instantaneous input to the pulse modulator unit 38, the capacitor charges longer and the resultant output pulse is longer. Similarly, a low amplitude input results in a shorter pulse. The output of the modulator unit 38 is applied to the pulse transmitter 34.

The pulse width charging capacitor operates only with positive input so the voice input signal is biased positively by the voice amplifier unit 30 to a level that is just high enough to assure a minimum width pulse output with a maximum amplitude (negative phase) voice input. With a zero amplitude voice input, the pulse width modulator unit 38 sees the bias value from the voice amplifier unit 30 and in response thereto, it generates a pulse of about 50 microsecond width. This pulse occurs in the silent periods between the syllables of the voice input and carries no useful information. If this pulse were converted to transmitter output bursts, it would decrease the overall system efficiency. Therefore, the voice-operated controller (VOC) unit 32 was incorporated to turn the transmitter unit 34 off during the zero-amplitude intervals. The turn-on rate has been made very fast to accommodate the initial speech transient. The turn-off rate has been made substantially slower than the turn-on rate in order to provide some coverage of the short periods between quickly voiced syllables.

The pulse transmitter unit 34 is an RC oscillator which generates a near-square wave at frequency of 1.1 MHz. The untuned output signal may be coupled to the receiver by a small loop antenna which was chosen because the input stage of the receiver is a tuned loopstick.

Turning the transmitter on and off is accomplished by two signals. One signal which comes from the pulse width modulator unit 38, and permits output to be generated during the time the modulating pulse is on. Each transmitting output burst may be understood as a fixed number of transmitted carrier pulses plus or minus another number of pulses proportional to the sampled instantaneous amplitude of voice input signal. The second turn-on signal comes from the voice operated controller which turns on the transmitter when the voice input signal exceeds a level slightly above the background noise. Its purpose is to avoid generating output when no information is to be handled by the IERCS voice link.

The schematic circuit diagram of the demonstration unit is shown in FIG. 5. The function of each circuit in conjunction with the others was covered during the previous discussion of the block diagram. In this section the internal elements of the circuits will be set forth.

The active audio amplifier comprises one section of a Quad Op-Amp unit, LM-324, which is connected by means of a negative feedback through a 33K ohm resistor that is bridged by a 3.3 nf capacitor. The audio amplifier unit provides a gain of 10 over the range of DC to about 2 KHz and then drops off slowly in response above that frequency. The voice input from the tape recorder is fed through a 1 μf capacitor in series with a 3300 ohm resistor to the audio amplifier input to provide low frequency cut off at about 100 Hz. This cutoff value was chosen lower than the optimum voice-based frequency in order to enhance the response of the voice operated control (VOC) circuit. The 3300 ohm resistor 50 which is connected back to +4 volts biases the audio output far enough positive to assure the modulator of a positive input over the entire range of voice input amplitude variation.

The timing oscillator which comprises one half of the NE556, Dual Timer unit, is used to generate a timing pulse that is used to initiate sampling of the amplified voice input signal. The 12K ohm and the 1K ohm resistors together with a 0.01 μf capacitor generate a pulse of approximately 7μ seconds in width which repeats approximately 10K times per second. The 7μ second pulse width assures the stable triggering of the modulator.

The pulse width modulator which comprises the other half of the NE556 Dual Timer unit is arranged to charge a 0.01 μf capacitor 52 through a 4700 ohm resistor 54 to the voltage value which appears on pin 11 that is connected directly to the output of the voice amplifier, pin 8. Upon reaching the point of equality, the capacitor 52 is discharged by the internal circuitry of the NE556 unit where it rests at a value close to zero until the next trigger pulse is received from the timer. The time constant was chosen to provide an output duty cycle ranging from less than 5% to more than 95% for typical maximum amplitude voice inputs. The output (pin 9 of NE556) of the pulse width modulator is fed to the input, pin 10 of the transmitter unit part of SN7400 through an attenuator that is formed from the 150 ohm resistor 56 and the 470 ohm resistor 58. The attenuator unit was required to reduce the 7 volt output signal of the NE556 unit to a level which was compatible with the 5 volt logic chip that was used for the transmitter unit, 60.

The transmitter which comprises three sections of a 7400 (Quad Dual Input Gate) are connected in a ring to act as a near-square wave oscillator. The 0.0018 μf capacitors 60, 62, 64, the 240 ohm resistors 66, 68 which are respectively connected between pins 3 and 9, pins 8 and 12, 13, and the 160 ohm resistor which is connected between pin 11 and 1, 2, reduce the free running frequency of the oscillator to 1.1 MHz. The modulation pulse from the modulator which is received at pin 10 turns the oscillator on when the pulse goes high (above +2.4 volts) The oscillator is turned off when the pulse is low. The wave form of the oscillator illustrates the concept of a high efficiency transmitter in that it only exhibits two states: either saturation or off. The heat energy dissipated by the transistors is minimized because in a linear amplitude modulator, heating results primarily from changes in the amplifier efficiency and is therefore low. In the time-variable, constant-amplitude pulse modulator, efficiency is maintained at a high level.

The last section of the transmitter IC unit SN7400 (pins 4, 5, 6) is used as an output switch which is controlled by the voice input signal from pin 7 of the voice operated controller (pins 5, 6, 7 of IC unit LM324). The gate (output switch) is opened when the voice signal amplitude exceeds the background noise level. The 910 ohm resistor 70 in series when the antenna is used to limit the output current in the transmitter antenna to a value that is compatible with the characteristics of the gate.

The voice operated controller which comprises the second section of the LM324 op-amp (pins 5, 6, 7) is used to generate a second gate signal to turn on the transmitter output switch. It is connected as a positive output rectifier with a gain of about 13. The 3.3 μf capacitor 72 with a 2700 ohm resistor 74 blocks the DC input to the audio amplifier until it is triggered by frequencies in the voice spectrum. The 36K resistor 76 and the diode 78 across it provides rectification and gain via feedback. The resultant signal is near saturation for reasonable voice input levels but can be too low for adequate output control with very low level inputs. The second diode 80, the 1100 ohm resistor 82 and the 4.7 μf capacitor 84 provide attack and release timing that correspond to general speech. The 200 ohm resistor 86 reduces the output to a value which is compatible with the characteristics of output gain.

The multi-tapped battery was chosen to provide the several voltages required by the demonstration unit: +8, +6, +4, 0, −4 volts respectively. The diode 88 which is in series with the +6 volt tap reduces the voltage of this source so as to be compatible with the 7400 (Quad Dual Input Gate) requirements. The battery was also incorporated in the demonstration unit to emphasize the efficiency and rocket lift compatibility constraints.

Although the invention has been described with reference to a particular embodiment, it will be understood to those skilled in the art that the invention is capable of a variety of alternative embodiments within the spirit and scope of the appended claims.

What is claimed is:

1. A pulse repetition modulator apparatus for an improved emergency rocket communication system comprising in combination:

a voice amplifier means to receive a voice input signal, said voice amplifier means amplifying said voice input signal to provide an audio output signal, a voice-operated controller means operatively connected to said voice amplifier means to provide a control signal when said voice amplifier means receives said voice input signal, a timing oscillator means to generate sampling pulse signals, a pulse width modulator means operatively connected to said timing oscillator to receive said sampling pulse signals, said pulse width modulator means operatively connected to said voice amplifier means to receive said audio output signal, said pulse width modulator means providing a modulated output signal, and, a pulse transmitter means operatively connected to said pulse width modulator means to receive said modulated output signal therefrom, said pulse transmitter means operatively connected to said voice-operated controller means to receive said control signal therefrom, said pulse transmitter means providing a radio output signal.

2. A pulse repetition modulator apparatus as described in claim 1 wherein said voice amplifier means comprises an active audio amplifier with a negative feedback loop from the output to the input.

3. A pulse repetition modulator apparatus as described in claim 1 wherein said modulated output signal from said pulse width modulator means comprises constant power pulses which can penetrate a nuclear environment.

4. A pulse repetition modulator apparatus as described in claim 1 wherein said control signal from said voice-operated controller means turns on said pulse transmitter means when said voice input signal exceeds a level slightly above the background noise.

5. A pulse repetition modulator apparatus as described in claim 1 wherein said pulse transmitter means comprises an RC oscillator which generates a near square wave at 1.1 MHz that is turned on and off by said control signal and said modulated output signal.

6. A pulse repetition modulator apparatus as described in claim 1 wherein said radio output signal comprises output signal burst of variable length with durations that are proportional to the amplitude of said voice input signal.

7. A pulse repetition modulator apparatus as described in claim 1 wherein said sampling pulse signals have a frequency of 10,000 pulses per second.

8. A pulse repetition modulator apparatus as described in claim 6 wherein each output signal burst comprises a fixed number of transmitted carrier pulses plus or minus another number of pulses which are proportional to the sampled instantaneous amplitude of said voice input signal.

* * * * *